(12) United States Patent
Song

(10) Patent No.: US 9,035,670 B2
(45) Date of Patent: May 19, 2015

(54) SEMICONDUCTOR MODULE, TEST SYSTEM AND METHOD EMPLOYING THE SAME

(75) Inventor: Won-Hyung Song, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 331 days.

(21) Appl. No.: 13/533,241

(22) Filed: Jun. 26, 2012

(65) Prior Publication Data

US 2013/0002277 A1    Jan. 3, 2013

(30) Foreign Application Priority Data

Jun. 29, 2011  (KR) .......................... 10-2011-0063585

(51) Int. Cl.
*H01L 21/00* (2006.01)
*G01R 31/319* (2006.01)

(52) U.S. Cl.
CPC .... *G01R 31/31919* (2013.01); *G01R 31/31908* (2013.01); *H01L 2924/0002* (2013.01)

(58) Field of Classification Search
USPC ............... 324/750.3, 762.01, 762.02, 762.03; 714/724, 726
See application file for complete search history.

(56) References Cited

U.S. PATENT DOCUMENTS 4,000,460 A * 12/1976 Kadakia et al. ............... 714/726
6,894,531 B1   5/2005 Nouban et al.

FOREIGN PATENT DOCUMENTS

JP   2001-351395   12/2001
JP   2008-171287   7/2008
KR   10-2009-0098506   9/2009

\* cited by examiner

*Primary Examiner* — Vincent Q Nguyen
(74) *Attorney, Agent, or Firm* — Onello & Mello, LLP.

(57) ABSTRACT

A semiconductor module includes a plurality of module pins and a semiconductor device. Module pins receive an identification pattern signal having M bits and outputs a test identification pattern, where M is a positive integer. The semiconductor device includes device pins, and outputs the identification pattern signal through the device pins in response to a connection identification control signal for identifying a configuration of pin connections between the module pins and the device pins. The semiconductor module effectively identifies a configuration of pin connections between the module pins and the device pins.

14 Claims, 12 Drawing Sheets

FIG. 7A

| | IPC | IPD |
|---|---|---|
| R1 | 0 0 0 | → 0 0 0 0 0 0 0 1 |
| R2 | 0 0 1 | → 0 0 0 0 0 0 1 0 |
| R3 | 0 1 0 | → 0 0 0 0 0 1 0 0 |
| R4 | 0 1 1 | → 0 0 0 0 1 0 0 0 |
| R5 | 1 0 0 | → 0 0 0 1 0 0 0 0 |
| R6 | 1 0 1 | → 0 0 1 0 0 0 0 0 |
| R7 | 1 1 0 | → 0 1 0 0 0 0 0 0 |
| R8 | 1 1 1 | → 1 0 0 0 0 0 0 0 |

FIG. 7B

| | IPD |
|---|---|
| R1 | 0 1 0 1 0 1 0 1 |
| R2 | 0 0 1 1 0 0 1 1 |
| R3 | 0 0 0 0 1 1 1 1 |

IC1 IC2 · · · IC8

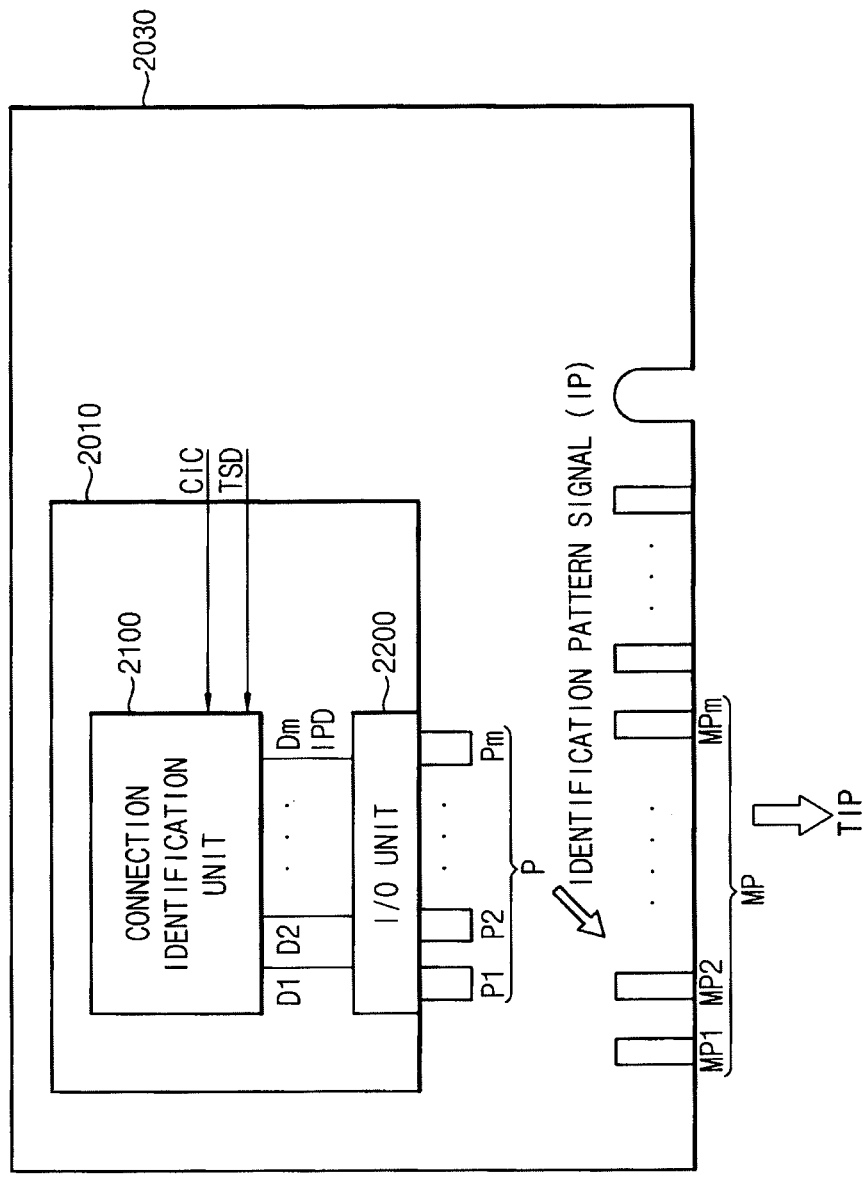

SEMICONDUCTOR MODULE, TEST SYSTEM AND METHOD EMPLOYING THE SAME

CROSS-REFERENCE TO RELATED APPLICATION(S)

This application claims priority under 35 USC §119 to Korean Patent Application No. 10-2011-0063585, filed on Jun. 29, 2011 in the Korean Intellectual Property Office (KIPO), the contents of which are herein incorporated by reference in their entirety.

BACKGROUND

1. Technical Field

Example embodiments relate to a semiconductor module, and more particularly to a semiconductor module and a test method and system that may include a semiconductor module.

2. Description of the Related Art

Generally, a semiconductor module may include one or more packaged semiconductor devices. A semiconductor module may include interconnect circuitry (also referred to herein as "wiring") that connects device pins of semiconductor devices to other devices within a module, and to pins of the semiconductor module so that a semiconductor device within the module may connect to an external device. A knowledge of the configuration of pin connections between device pins and module pins may be required in order to test the semiconductor module.

SUMMARY

Example embodiments in accordance with principles of inventive concepts may provide a semiconductor module that outputs a pattern used for identifying a configuration of pin connections between the module pins and the device pins.

Example embodiments in accordance with principles of inventive concepts may provide a test system including the semiconductor module.

A semiconductor module in accordance with principles of inventive concepts may include a plurality of module pins and a semiconductor device. The plurality of module pins may receive an identification pattern signal having M bits (where M is a positive integer) and may output a test identification pattern. The semiconductor device may include a plurality of device pins, and may output the identification pattern signal through the plurality of device pins in response to a connection identification control signal for identifying a configuration of pin connections between the plurality of module pins and the plurality of device pins.

A semiconductor device in accordance with principles of inventive concepts may include a connection identification unit configured to output a connection identification pattern in response to a connection identification control signal. Such a device may also include an input output (IO) unit configured to receive a connection identification pattern and to output a connection identification pattern through the plurality of device pins as an identification pattern signal.

A connection identification unit in accordance with principles of inventive concepts may include a register block configured to store a connection identification pattern. A connection identification unit may also include a control block configured to control a register block that outputs a connection identification pattern in response to a connection identification control signal.

A register block in accordance with principles of inventive concepts may include an N-bit register configured to store a pattern code that corresponds to a connection identification pattern. The register block may also include a pattern decoder configured to receive a pattern code and to generate a connection identification pattern having M bits by decoding the pattern code. In exemplary embodiments in accordance with principles of inventive concepts a pattern code may have N bits, where N is a positive integer smaller than M.

The register block may include an M-bit register configured to store a connection identification pattern having M bits. The M-bit register may be configured to output a connection identification pattern to an IO unit. Additionally, the M-bit register may include a multi purpose register (MPR) of a semiconductor device.

In accordance with principles of inventive concepts, a connection identification unit may include a pattern generating block configured to generate a connection identification pattern, and a control block configured to control the pattern generating block to output the connection identification pattern in response to a connection identification control signal.

In example embodiments in accordance with principles of inventive concepts, a semiconductor device may include a connection identification unit configured to output a connection identification pattern in response to a connection identification control signal and a seed data. The device may also include an input output (IO) unit configured to receive a connection identification pattern and to output a connection identification pattern through a plurality of device pins as an identification pattern signal.

A connection identification unit in accordance with principles of inventive concepts may include a register block configured to store a connection identification pattern. A connection identification unit in accordance with principles of inventive concepts may also include a control block that is configured to control a register block to output a connection identification pattern corresponding to seed data in response to a connection identification control signal.

In example embodiments in accordance with principles of inventive concepts, a semiconductor device may include a connection identification unit configured to output a connection identification pattern in response to a connection identification control signal and to output an IO control signal based on a seed data received from outside. In example embodiments in accordance with principles of inventive concepts, a semiconductor device may also include and an input output (IO) unit configured to receive a connection identification pattern and to output a connection identification pattern through a plurality of device pins as an identification pattern signal based on an IO control signal.

An IO unit in accordance with principles of inventive concepts may include a switch block configured to control a connection between a connection identification unit and a plurality of device pins, based on an IO control signal. Such an IO unit may further include a stabilizing block configured to stabilize a signal level of a plurality of device pins based on the IO control signal.

In example embodiments in accordance with principles of inventive concepts, each bit of an identification pattern signal may correspond to each of a plurality of device pins, respectively, and one bit of an identification pattern signal may have a first value and the remaining bits of the identification pattern signal may have a second value. The semiconductor device may output a plurality of identification pattern signals in a predetermined order, where one of a plurality of the identification pattern signals corresponds to one of a plurality of device pins.

In example embodiments in accordance with principles of inventive concepts, a semiconductor device may output a pattern sequence including L identification pattern signals, where L is a positive integer smaller than M. The pattern sequence may include M identification codes, where each of the M identification codes has L bits, and one of the M identification codes corresponds to one of a plurality of device pins.

According to example embodiments in accordance with principles of inventive concepts, a test system may include a semiconductor module and a module testing device. The semiconductor module may output a test identification pattern in response to a connection identification control signal. The module testing device may output a connection identification control signal, and identify a configuration of pin connections of the semiconductor module based on a test identification pattern. The semiconductor module may comprise a plurality of module pins and a semiconductor device. A plurality of module pins may receive an identification pattern signal having M bits and output a test identification pattern, where M is a positive integer. The semiconductor device may include a plurality of device pins, and may output an identification pattern signal through a plurality of device pins in response to a connection identification control signal for identifying a configuration of pin connections between the plurality of module pins and the plurality of device pins.

In accordance with principles of inventive concepts, a semiconductor module that includes a semiconductor device with M pins connected to M pins of the module generates one or more M-bit wide data patterns, each of which is uniquely associated with a device pin. The module supplies an M-bit wide data pattern to module pins to identify a coupling between a device pin and a module pin. An electronics module may supply such an M-bit wide coupling identification pattern to its pins in response to a signal received from outside the module. In accordance with principles of inventive concepts, an electronics module may operate in a variety of modes, including a normal operation mode and a mode in which it supplies a coupling data pattern to its pins. Each M-bit wide coupling-identification data pattern data may include one bit having a logical value that is opposite that of the remaining bits. One or more of the coupling-identification data patterns may be supplied to module pins in a sequence that permits the association of a data pattern with a device pin. For example a first data pattern may be associated with a first device pin, a second data pattern may be associated with a second device pin, etc.

BRIEF DESCRIPTION OF THE DRAWINGS

Illustrative, non-limiting example embodiments will be more clearly understood from the following detailed description in conjunction with the accompanying drawings.

FIG. 7A is a diagram illustrating an example of an N-bit register included in a connection identification unit in accordance with principles of inventive concepts of FIG. 2.

FIG. 7B is a diagram illustrating an example of an M-bit register included in a connection identification unit in accordance with principles of inventive concepts of FIG. 3.

FIG. 8 is a block diagram illustrating a semiconductor module according to example embodiments in accordance with principles of inventive concepts.

DETAILED DESCRIPTION OF THE EMBODIMENTS

Figure 1:
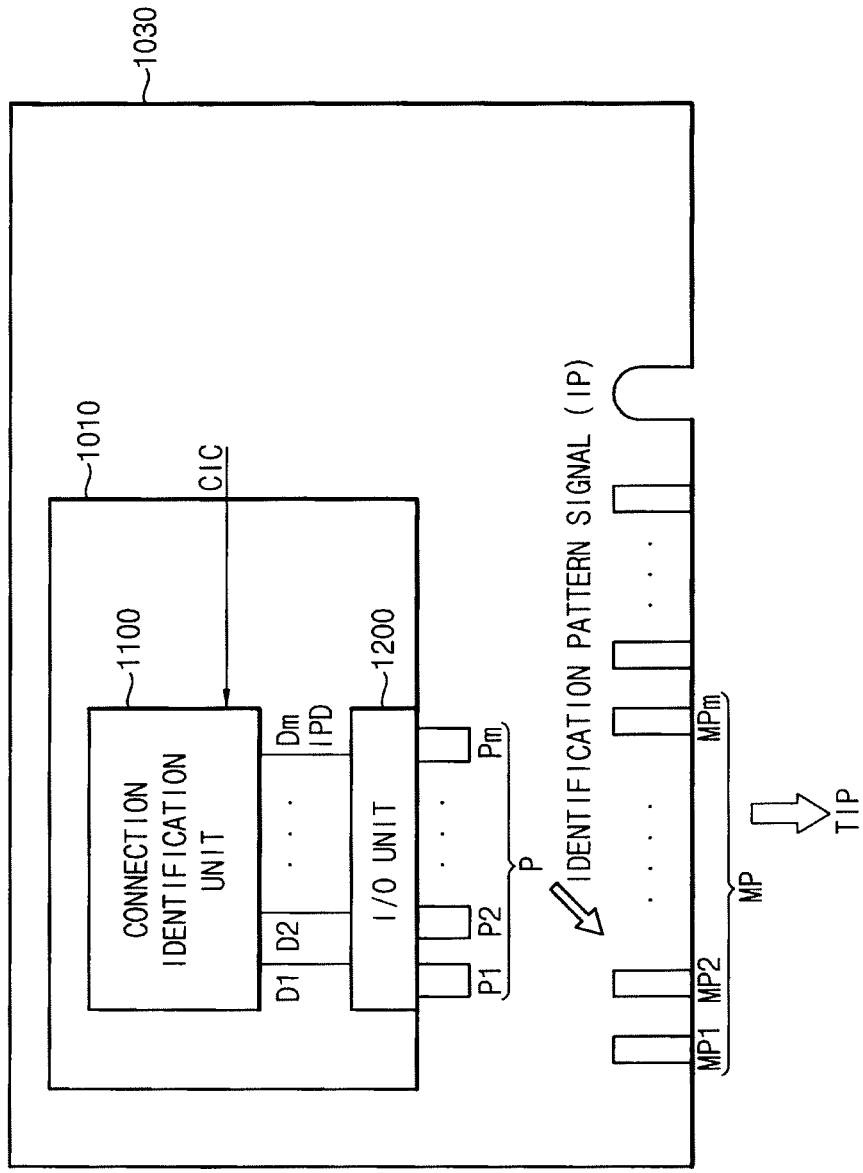
FIG. 1 is a block diagram illustrating a semiconductor module according to example embodiments in accordance with principles of inventive concepts.

Exemplary embodiments of inventive concepts will now be described more fully with reference to the accompanying drawings, in which exemplary embodiments of inventive concepts are shown. Exemplary embodiments of inventive concepts may, however, be embodied in many different forms and should not be construed as limited to the embodiments set forth herein; rather, these exemplary embodiments of inventive concepts are provided so that this description will be thorough and complete, and will fully convey the concept of exemplary embodiments of inventive concepts to those of ordinary skill in the art. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of inventive concepts only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of inventive concepts are described herein with reference to cross-sectional illustrations that are schematic illustrations of idealized exemplary embodiments of inventive concepts (and intermediate structures). As such, variations from the shapes of the illustrations as a result, for example, of manufacturing techniques and/or tolerances, are to be expected. Thus, exemplary embodiments of inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an exemplary embodiment in accordance with principles of inventive concepts, a semiconductor module 1000 depicted in FIG. 1 includes a plurality of module pins MP1, MP2, . . . , MPm (where M is a positive integer) and a semiconductor device 1010.

Semiconductor device 1010 may include a plurality of device pins P1, P2, . . . , Pm. Semiconductor device 1010 may output an identification pattern signal IP through a plurality of device pins P1, P2, . . . , Pm in response to a connection identification control signal CIC. Identification pattern signal (IP) may be used for identifying a configuration of pin connections between a plurality of module pins MP1, MP2, . . . , MPm and a plurality of device pins P1, P2, . . . , Pm.

In exemplary embodiments in accordance with principles of inventive concepts, semiconductor device 1010 may further include a connection identification unit 1100 and an input output (IO) unit 1200.

Connection identification unit 1100 may output a connection identification pattern IPD in response to connection identification control signal CIC. Connection identification control signal CIC may be provided from outside of semiconductor module 1000, for example. Connection identification control signal CIC may include a signal indicating a start of a connection identification operation.

IO unit 1200 may receive connection identification pattern IPD and output connection identification pattern IPD through a plurality of device pins P1, P2, . . . , Pm as the identification pattern signal IP. The plurality of device pins P1, P2, . . . , Pm may include data pins for outputting and receiving data, for example.

Semiconductor device 1010 may operate in one of a plurality of modes, including a connection identification mode and a normal operation mode, for example. In a connection identification mode, semiconductor device 1010 may perform a connection identification operation by outputting a connection identification pattern IPD that is provided from a connection identification unit 1100. In a normal operation mode, semiconductor device 1010 may output a signal generated by performing an operation appropriate for the normal functioning of device 1010 (also referred to herein as a "proper operation"). For example, if semiconductor device 1010 is a semiconductor memory device, semiconductor device 1010 may read data from a memory cell and output read data in a normal operation mode. The semiconductor device 1010 may operate in one of the modes, e.g., a connection identification mode or a normal operation mode, in response to a control signal received from outside semiconductor module 1000. IO unit 1200 may output a connection identification pattern IPD as an identification pattern signal IP in a connection identification mode and output a signal generated by performing a proper operation in a normal operation mode.

A connection identification pattern IPD may be used for identifying a configuration of pin connections between a plurality of module pins MP1, MP2, . . . , MPm and a plurality of device pins P1, P2, . . . , Pm. A connection identification pattern IPD may include M bits. Connection identification unit 1100 may provide each bit of a connection identification pattern IPD to IO unit 1200 through each of data lines D1, D2, . . . , Dm, respectively. IO unit 1200 may output each bit of connection identification pattern IPD through a plurality of device pins P1, P2, . . . , Pm as the identification pattern signal IP.

Module pins MP1, MP2, MPm may be connected to device pins P1, P2, . . . , Pm by wiring according to a predetermined circuit design. For example, a configuration of pin connections between module pins MP1, MP2, . . . , MPm and device pins P1, P2, . . . , Pm may be determined in consideration of a routing of the wiring.

Module pins MP1, MP2, . . . , MPm may receive identification pattern signal IP and output test identification pattern TIP. Identification pattern signal IP and test identification pattern TIP may have M bits, for example. Bits of test identification pattern TIP may have a different arrangement from bits of identification pattern signal IP. For example, test identification pattern TIP may be generated by rearranging bits of identification pattern signal IP according to a configuration of pin connections between module pins MP1, MP2, . . . , MPm and device pins P1, P2, . . . , Pm. Module pins MP1, MP2, . . . , MPm may be coupled to a device external to module 1000.

In exemplary embodiments in accordance with principles of inventive concepts, each bit of identification pattern signal IP may correspond to each of device pins P1, P2, . . . , Pm, respectively. One bit of identification pattern signal IP may have a first value and the remaining bits of identification pattern signal IP may have a second value. Therefore, identification pattern signal IP may indicate one of device pins P1, P2, . . . , Pm. The first value may be '1' and the second value may be '0,' for example. Alternatively, the first value may be '0' and the second value may be '1'. Semiconductor device 1010 may output a plurality of identification pattern signals IP in a predetermined order, where one of the identification pattern signals IP may correspond to one of the device pins P1, P2, . . . , Pm.

In other exemplary embodiments in accordance with principles of inventive concepts, semiconductor device 1010 may output a pattern sequence including L identification pattern signals IP, where L is a positive integer smaller than M. The pattern sequence may include M identification codes. Each of the M identification codes may have L bits. One of the M identification codes may correspond to one of the device pins P1, P2, . . . , Pm.

Semiconductor device 1010 may be mounted on a chip using various packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline package (TSOP), system in package (SIP), multi chip package (MCP), wafer-level fabricated package (WFP), wafer-level processed stack package (WSP), etc.

Figure 15:
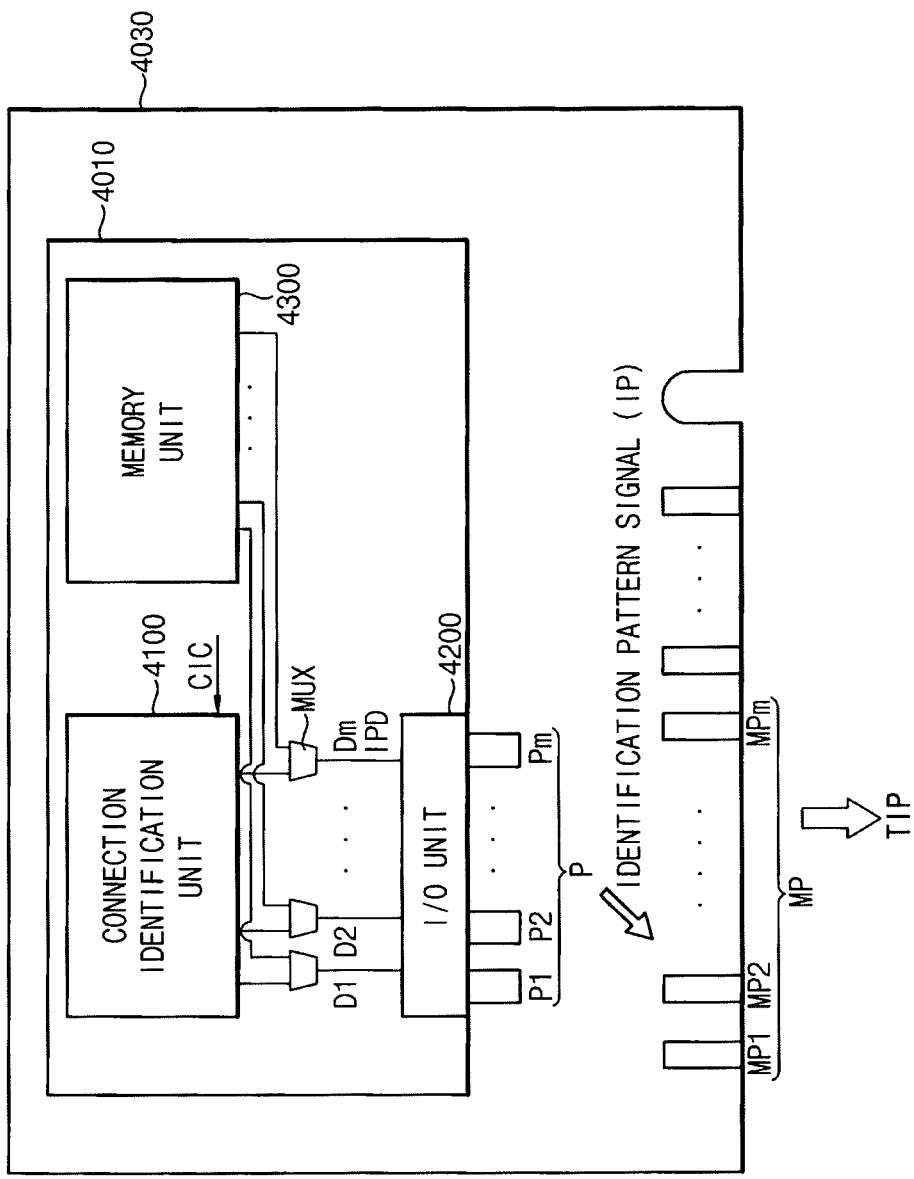
FIG. 15 is a block diagram illustrating a semiconductor module according to example embodiments in accordance with principles of inventive concepts.

Semiconductor module 1000 may further include a printed circuit board (PCB) 1030 on which semiconductor device 1010 and module pins MP1, MP2, . . . , MPm are formed. Printed circuit board 1030 may have wiring that couples module pins MP1, MP2, . . . , MPm with device pins P1, P2, . . . , Pm. The configuration of the wiring between module pins MP1, MP2, . . . , MPm and device pins P1, P2, . . . , Pm may be predetermined in consideration of a routing of the wiring. In exemplary embodiments in accordance with principles of inventive concepts, as illustrated in FIG. 15, semiconductor module 1000 may be a semiconductor memory module.

As described above, semiconductor module 1000 in accordance with principles of inventive concepts may output a test identification pattern TIP in response to a connection identification control signal CIC. Identification pattern signal IP may have a predetermined pattern such that at least one identification pattern signal IP may indicate one of device pins P1, P2, . . . , Pm. Test identification pattern TIP may be generated, for example, by rearranging bits of identification pattern signal IP according to the configuration of the wiring between module pins MP1, MP2, MPm and device pins P1, P2, . . . , Pm. Therefore, the configuration of pin connections between module pins MP1, MP2, . . . , MPm and device pins P1, P2, . . . , Pm may be effectively identified by comparing a test identification pattern TIP with identification pattern signal IP, which has a predetermined pattern.

Figure 2:
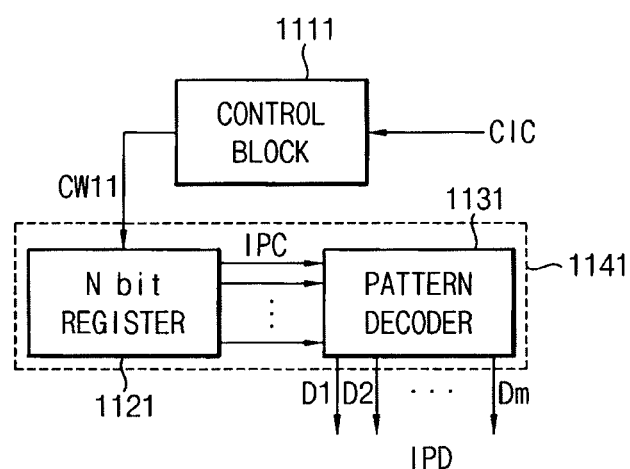
FIGS. 2, 3 and 4 are block diagrams illustrating examples of a connection identification unit in accordance with principles of inventive concepts included in a semiconductor module of FIG. 1.

In an exemplary embodiment in accordance with principles of inventive concepts, a semiconductor module 1000 may include a connection identification unit as depicted in the exemplary block diagram of FIG. 2. In an exemplary embodiment in accordance with principles of inventive concepts, connection identification unit 1101 may include a register block 1141 and a control block 1111. Register block 1141 may store a plurality of the connection identification patterns IPD. Control block 1111 may generate a register control signal CW11 in response to a connection identification control signal CIC received by control the register block 1141 to output a plurality of connection identification patterns IPD.

Register block 1141 may include an N-bit register 1121 and a pattern decoder 1131, where N is a positive integer smaller than M. N-bit register 1121 may store a pattern code IPC that corresponds to a connection identification pattern IPD. Pattern code IPC may have N bits and may be an encrypted version of connection identification pattern IPD. N-bit register 1121 may output pattern code IPC in response to the register control signal CW11.

Pattern decoder 1131 may receive a pattern code IPC having N bits from N-bit register 1121 and generate a connection identification pattern IPD having M bits by decoding pattern code IPC. Pattern decoder 1131 may provide each bit of the connection identification pattern IPD to IO unit 1200 through each of data lines D1, D2, . . . , Dm, respectively. Pattern decoder 1131 may include an N-to-M multiplexer and M may be $2^N$.

Figure 3:
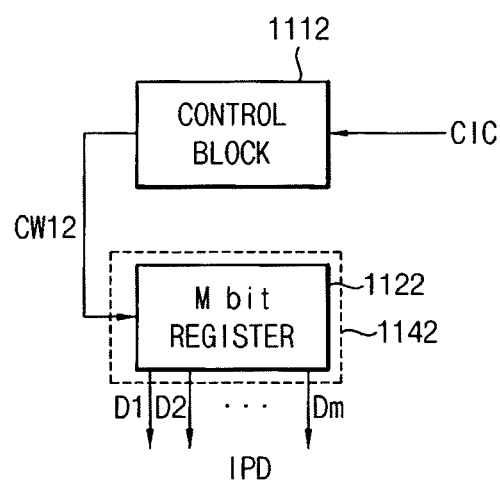

In an exemplary embodiment in accordance with principles of inventive concepts, a semiconductor module 1000 may include a connection identification unit 1102 as illustrated in the block diagram of FIG. 3. Connection identification unit 1102 may include a register block 1142 and a control block 1112. Register block 1142 may store a plurality of connection identification patterns IPD. Control block 1112 may generate a register control signal CW12 in response to a connection identification control signal CIC to control register block 1142 to output a plurality of the connection identification patterns IPD.

Register block 1142 may include an M-bit register 1122 that stores a connection identification pattern IPD having M bits. M-bit register 1122 may provide each bit of a connection identification pattern IPD to IO unit 1200 through each of data lines D1, D2, . . . , Dm, respectively, in response to the register control signal CW12. M-bit register 1122 may include a multi purpose register (MPR) of semiconductor device 1000, for example. In exemplary embodiments in accordance with principles of inventive concepts, M-bit register 1122 may be able to store more than M bits data.

Figure 4:
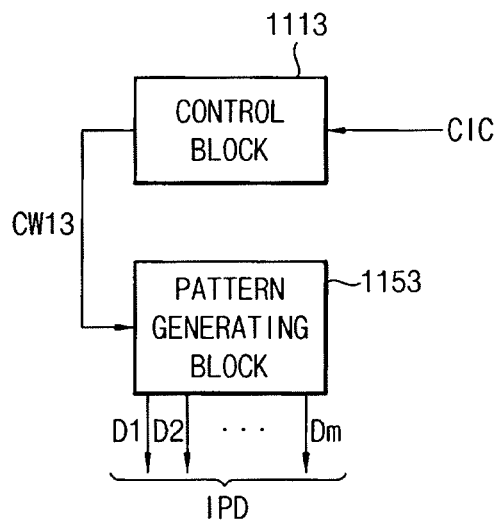

In an exemplary embodiment in accordance with principles of inventive concepts, a semiconductor module 1000 may include a connection identification unit 1103 as illustrated in the block diagram of FIG. 4. A connection identification unit 1103 may include a pattern generating block 1153 and a control block 1113. Pattern generating block 1153 may generate a plurality of connection identification patterns IPD. Control block 1113 may generate a block control signal CW13 in response to connection identification control signal CIC to control pattern generating block 1153 to generate a plurality of connection identification patterns IPD.

Pattern generating block 1153 may generate a connection identification pattern IPD in response to a block control signal CW13 and provide each bit of connection identification pattern IPD to IO unit 1120 through each of the data lines D1, D2, . . . , Dm, respectively. For example, pattern generating block 1153 may generate a plurality of connection identification patterns IPD illustrated in FIG. 7A or FIG. 7B in response to block control signal CW13 and provide the connection identification patterns IPD in a predetermined order.

Figure 5:
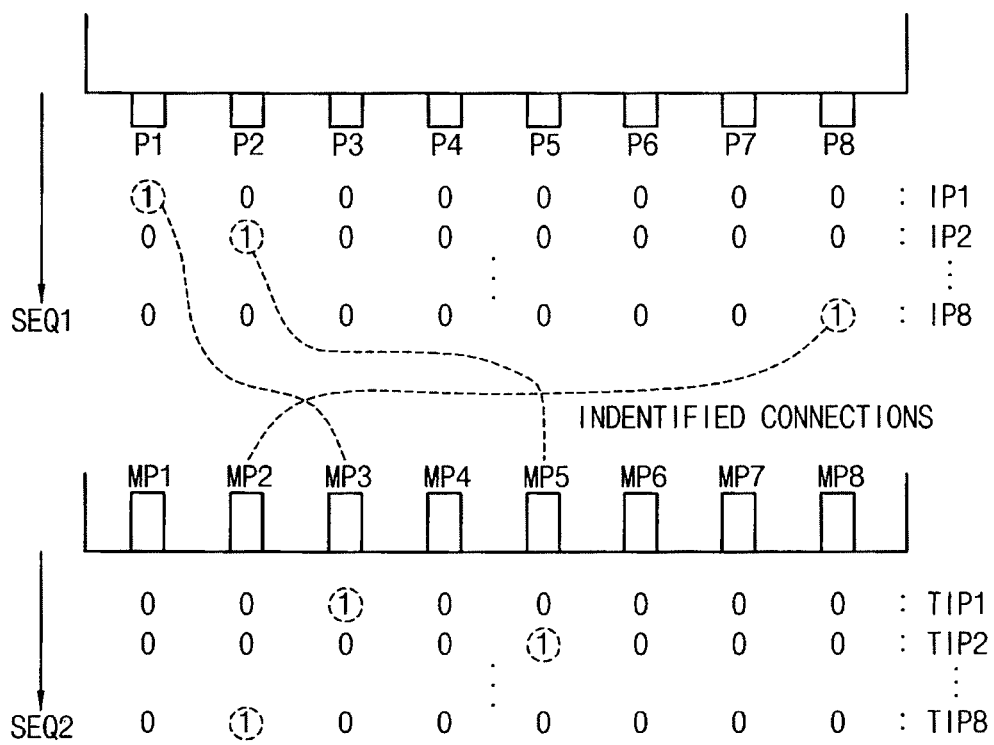
FIGS. 5 and 6 are diagrams for describing a connection identification operation of a semiconductor module in accordance with principles of inventive concepts of FIG. 1.
Figure 6:
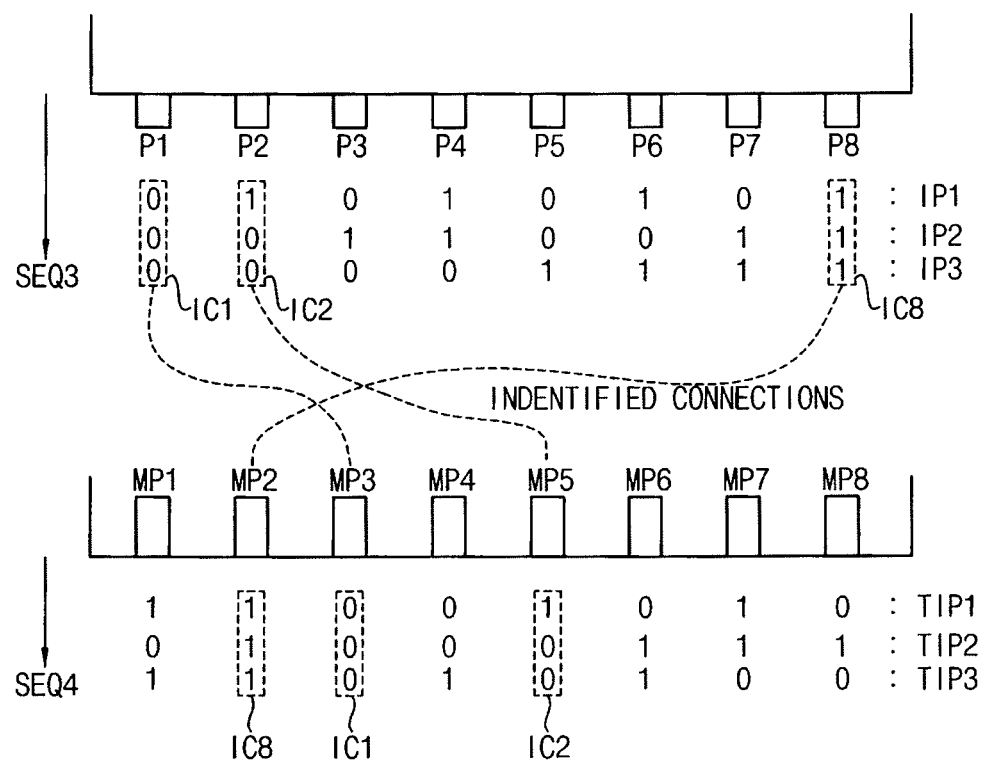

An exemplary embodiment of a semiconductor module connection identification process in accordance with principles of inventive concepts will be described in the discussion related to FIGS. 5 and 6. In FIGS. 5 and 6, the connection identification pattern IPD, the identification pattern signal IP and the test identification pattern TIP have eight bits as an example. That is, M is eight in FIGS. 5 and 6. However, embodiments are not limited thereto.

Referring to FIGS. 1 and 5, semiconductor device 1010 may output a first pattern sequence SEQ1 that includes eight identification pattern signals IP1, IP2, IP8, each of which has eight bits, available through eight device pins P1, P2, ..., P8. Each bit of identification pattern signal IP may correspond to each of the eight device pins P1, P2, ..., P8, respectively, and one bit of the identification pattern signal IP may have a first value and the remaining bits of the identification pattern signal IP may have a second value. The first value may be '1' and the second value may be '0'. For example, a first bit of a first identification pattern signal IP1 may be the first value and the rest bits of the first identification pattern signal IP1 may be the second value, a second bit of a second identification pattern signal IP2 may be the first value and the rest bits of the second identification pattern signal IP2 may be the second value, and so on. Therefore, one of the eight identification pattern signals IP1, IP2, ..., IP8 may indicate one of the eight device pins P1, P2, ..., P8. Semiconductor device 1010 may output the eight identification pattern signals IP1, IP2, ..., IP8 through the eight device pins P1, P2, ..., P8 in a predetermined order, for example.

Eight module pins MP1, MP2, ..., MP8 may receive a first pattern sequence SEQ1 that includes eight identification pattern signals IP1, IP2, ..., IP8 and output a second pattern sequence SEQ2 including eight test identification patterns TIP1, TIP2, ..., TIP8. Each of the eight test identification patterns TIP1, TIP2, ..., TIP8 may be generated by rearranging bits of a corresponding identification pattern signal IP according to a configuration of pin connections between the eight module pins MP1, MP2, ..., MP8 and the eight device pins P1, P2, ..., P8, for example.

An exemplary embodiment of a semiconductor module connection identification process in accordance with principles of inventive concepts will be described in the discussion related to FIGS. 1 and 5.

Semiconductor device 1010 may output a Kth identification pattern signal IPk (where K is a positive integer smaller than M) through the eight device pins P1, P2, ..., P8, in response to a connection identification control signal CIC. A Kth bit of the Kth identification pattern signal IPk may have a first value and the remaining bits of the Kth identification pattern signal IPk may have a second value. A Kth test identification pattern TIPk, which may be generated by rearranging bits of the Kth identification pattern signal IPk according to the configuration of pin connections between the eight module pins MP1, MP2, ..., MP8 and the eight device pins P1, P2, ..., P8, may be output through the eight module pins MP1, MP2, ..., MP8. One of the eight module pins MP1, MP2, ..., MP8 that outputs the first value of the Kth test identification pattern TIPk may be coupled with one of the eight device pins P1, P2, ..., P8 that outputs the first value of the Kth identification pattern signal IPk. Therefore, the configuration of the pin connections between the module pins MP1, MP2, ..., MPm and the device pins P1, P2, ..., Pm may be effectively identified by comparing a test identification pattern TIP with an identification pattern signal IP, which has a predetermined pattern. The configuration of pin connections between module pins MP1, MP2, ..., MPm and device pins P1, P2, ..., Pm may be identified by a module testing device 5010 of FIG. 16. For example, as illustrated in FIG. 5, module testing device 5010 may identify that a first device pin P1 is coupled with a third module pin MP3, a second device pin P2 is coupled with a fifth module pin MP5 and an eighth device pin P8 is coupled with a second module pin MP2 by comparing test identification pattern TIP with identification pattern signal IP.

Referring to FIGS. 1 and 6, semiconductor device 1010 may output a third pattern sequence SEQ3 including L identification pattern signals IP (where L is a positive integer smaller than M) through device pins P1, P2, ..., Pm. The third pattern sequence SEQ3 may include M identification codes IC. The M identification codes IC may be different from each other. Each of the M identification codes IC may have L bits. One of the M identification codes IC may indicate one of device pins P1, P2, ..., Pm.

In an exemplary embodiment in accordance with principles of inventive concepts as illustrated in FIG. 6, M is eight and L is three. The third pattern sequence SEQ3 may include three identification pattern, signals IP1, IP2 and IP3, each of which may have eight bits. Semiconductor device 1010 may output three identification pattern signals IP1, IP2 and IP3 through eight device pins P1, P2, ..., P8. Third pattern sequence SEQ3 may include eight identification codes IC1, IC2, ..., IC8, for example. Each of the eight identification codes IC1, IC2, ..., IC8 may have three bits. One of the eight identification codes IC1, IC2, ..., IC8 may indicate one of the eight device pins P1, P2, ..., P8. For example, a first identification code IC1 may indicate a first device pin P1, a second identification code IC2 may indicate a second device pin P2, and an eighth identification code IC8 may indicate an eighth device pin P8.

Eight module pins MP1, MP2, ..., MP8 may receive the third pattern sequence SEQ3 including the three identification pattern signals IP1, IP2 and IP3 and output a fourth pattern sequence SEQ4 including three test identification patterns TIP1, TIP2 and TIP3. Each of the three test identification patterns TIP1, TIP2 and TIP3 may be generated by rearranging bits of a corresponding identification pattern signal IP according to the configuration of pin connections between eight module pins MP1, MP2, ..., MP8 and eight device pins P1, P2, ..., P8.

An exemplary connection identification operation of semiconductor module 1000 in accordance with principles of inventive concepts will be described with reference to FIGS. 1 and 6. Semiconductor device 1010 may output third pattern sequence SEQ3 including three identification pattern signals IP1, IP2 and IP3, through the eight device pins P1, P2, ..., P8. The fourth pattern sequence SEQ4, including three test identification patterns TIP1, TIP2 and TIP3, may be output through the eight module pins MP1, MP2, ..., MP8. As previously indicated, the three test identification patterns, TIP1, TIP2 and TIP3, may be generated by rearranging bits of a corresponding identification pattern signal IP according to the configuration of pin connections between the eight module pins MP1, MP2, ..., MP8 and the eight device pins P1, P2, ..., P8, for example.

Both the third pattern sequence SEQ3 and the fourth pattern sequence SEQ4 may include the same eight identification codes IC1, IC2, ..., IC8. One of the eight module pins MP1, MP2, ..., MP8 that outputs a Kth identification code ICk may be coupled with one of the eight device pins P1, P2, ..., P8 that outputs the Kth identification code ICk. Therefore, the configuration of the pin connections between the plurality of module pins MP1, MP2, ..., MPm and the plurality of device pins P1, P2, ..., Pm may be effectively identified by comparing the M identification codes IC included in the fourth pattern sequence SEQ4 with the M identification codes IC included in the third pattern sequence SEQ3. The configuration of pin connections between module pins MP1, MP2, ..., MPm and device pins P1, P2, ..., Pm may be identified by module testing device 5010 of FIG. 16, for example. As illustrated in FIG. 6, module testing device 5010 may identify that a first device pin P1 is coupled with a third module pin MP3, a second device pin P2 is coupled with a fifth module pin MP5, and an eighth device pin P8 is coupled with a second module pin MP2 by comparing the M identification codes IC included in the fourth pattern sequence SEQ4 with the M identification codes IC included in the third pattern sequence SEQ3, for example.

In an exemplary embodiment in accordance with principles of inventive concepts as illustrated in a diagrammatic representation of FIG. 7A of an N-bit register 1121 such as may be included of in a connection identification unit of FIG. 2, the N-bit register 1121 may store a plurality of pattern codes IPC that correspond to each of the connection identification patterns IPD. For example, when the number of bits included in a connection identification pattern IPD is eight, the number of bits included in the pattern code IPC may be three. The pattern decoder 1131 may read pattern code IPC from N-bit register 1121 and generate connection identification pattern IPD, which has only one bit of the first value, based on pattern code IPC.

FIG. 7B is a diagram illustrating an example of an M-bit register which may be included in a connection identification unit of FIG. 3 in accordance with principles of inventive concepts. M-bit register 1122 may store L connection identification pattern IPD, where L is a positive integer smaller than M. The M-bit register 1122 may store M identification codes IC1, IC2, ..., IC8, each of which has L bits. For example, when the number of bits included in a connection identification pattern IPD is eight, the number of bits included in identification code IC may be three. The M identification codes IC1, IC2, ..., IC8 may be different from each other.

FIG. 8 is a block diagram illustrating a semiconductor module 2000 in accordance with principles of inventive concepts. In this exemplary embodiment, semiconductor module 2000 includes a plurality of module pins MP1, MP2, ..., MPm and a semiconductor device 2010, where M is a positive integer. Semiconductor module 2000 may have the same structure and operation as semiconductor module 1000 of FIG. 1 except that semiconductor device 2010 included in the semiconductor module 2000 further receives a seed data TSD, for example. A structure and an operation of the semiconductor module 1000 of FIG. 1 are described above with reference to FIGS. 1 to 7B. Therefore, a duplicated description of the semiconductor module 2000 of FIG. 8 will be omitted.

Semiconductor device 2010 may output an identification pattern signal IP through device pins P1, P2, ..., Pm in response to connection identification control signal CIC and seed data TSD. For example, semiconductor device 2010 may select identification pattern signal IP based on seed data TSD. Connection identification control signal CIC and seed data TSD may be provided from outside of semiconductor module 2000, for example.

Semiconductor device 2010 may include a connection identification unit 2100 and an input output (IO) unit 2200. Connection identification unit 2100 may output connection identification pattern IPD in response to connection identification control signal CIC and seed data TSD. Connection identification control signal CIC may include a signal indicating a start of a connection identification operation, for example.

IO unit 2200 may receive connection identification pattern IPD and output connection identification pattern IPD through device pins P1, P2, ..., Pm as identification pattern signal IP. Device pins P1, P2, ..., Pm may include data pins for outputting and receiving data.

In some example embodiments, each bit of identification pattern signal IP may correspond to each of the plurality of device pins P1, P2, ..., Pm, respectively, and one bit of identification pattern signal IP may have a first value and the remaining bits of identification pattern signal IP may have a second value. Therefore, identification pattern signal IP may indicate one of device pins P1, P2, ..., Pm. The first value may be '1' and the second value may be '0'. Alternatively, the first value may be '0' and the second value may be '1'. The semiconductor device 2010 may output a plurality of identification pattern signals IP in an order determined based on seed data TSD, where one of the identification pattern signals IP may correspond to one of device pins P1, P2, ..., Pm.

In other example embodiments in accordance with principles of inventive concepts, semiconductor device 2010 may output a pattern sequence including L identification pattern signals IP, where L is a positive integer smaller than M. The pattern sequence may include M identification codes. Each of the M identification codes may have L bits. One of the M identification codes may correspond to one of the device pins P1, P2, ..., Pm. The semiconductor device 2010 may output the L identification pattern signals IP included in the pattern sequence in an order determined based on the seed data TSD, for example.

Semiconductor module 2000 may further include a printed circuit board (PCB) 2030 on which semiconductor device 2010 and module pins MP1, MP2, ..., MPm are formed. Printed circuit board 2030 may have wiring that couples module pins MP1, MP2, ..., MPm to device pins P1, P2, ..., Pm. The configuration of the wiring between module pins MP1, MP2, ..., MPm and device pins P1, P2, ..., Pm may be predetermined in consideration of a routing of the wiring. In exemplary embodiments in accordance with principles of inventive concepts, as illustrated in FIG. 15, semiconductor module 2000 may be a semiconductor memory module.

As described above, semiconductor module 2000 according to example embodiments may output a test identification pattern TIP in response to connection identification control signal CIC and seed data TSD. Identification pattern signal IP may have a predetermined pattern such that at least one identification pattern signal IP may indicate one of device pins P1, P2, ..., Pm. Test identification pattern TIP may be generated by rearranging bits of identification pattern signal IP according to the configuration of wiring between module pins MP1, MP2, ..., MPm and device pins P1, P2, ..., Pm. Therefore, the configuration of pin connections between module pins MP1, MP2, ..., MPm and device pins P1, P2, ..., Pm may be effectively identified by comparing test identification pattern TIP with identification pattern signal IP, which has a predetermined pattern.

Figure 9:
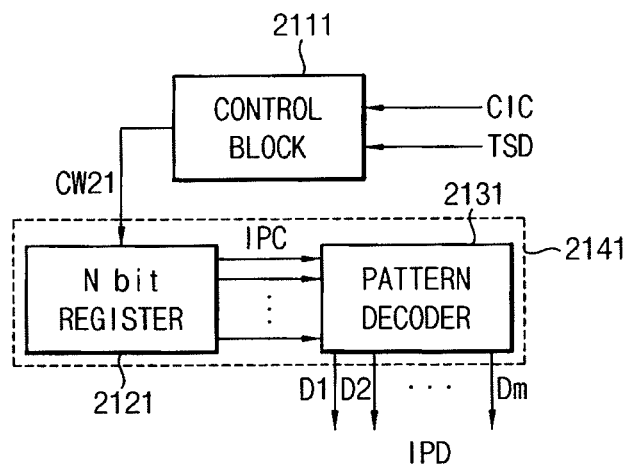
FIGS. 9 and 10 are block diagrams illustrating examples of a connection identification unit included in a semiconductor module in accordance with principles of inventive concepts of FIG. 8.

FIG. 9 is a block diagram illustrating an exemplary embodiment of a connection identification unit 2101 included in a semiconductor module of FIG. 8 in accordance with principles of inventive concepts. Connection identification unit 2101 may include a register block 2141 and a control block 2111. Register block 2141 may store a plurality of connection identification patterns IPD. Control block 2111 may generate a register control signal CW21 in response to connection identification control signal CIC and seed data TSD to control register block 2141 to output connection identification pattern IPD corresponding to seed data TSD.

Register block 2141 may include an N-bit register 2121 and a pattern decoder 2131, where N is a positive integer smaller than M. N-bit register 2121 may store pattern code IPC that corresponds to connection identification pattern IPD. Pattern code IPC may have N bits. Pattern code IPC may be an encrypted version of connection identification pattern IPD. Seed data TSD may include pattern code IPC. N-bit register 2121 may output one of the pattern codes IPC stored in the N-bit register 2121, which corresponds to seed data TSD, in response to register control signal CW21, for example.

Pattern decoder 2131 may receive pattern code IPC having N bits from N-bit register 2121 and generate connection identification pattern IPD having M bits by decoding pattern code IPC. Pattern decoder 2131 may provide each bit of connection identification pattern IPD to IO unit 2200 through each of data lines D1, D2, . . . , Dm, respectively. Pattern decoder 2131 may include an N-to-M multiplexer. In this case, M may be $2^N$.

Figure 10:
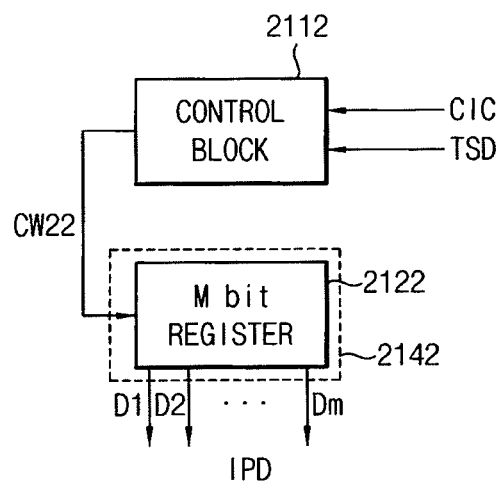

FIG. 10 is a block diagram illustrating another exemplary embodiment of a connection identification unit in accordance with principles of inventive concepts such as may be included in a semiconductor module of FIG. 8. Connection identification unit 2102 may include a register block 2142 and a control block 2112. Register block 2142 may store a plurality of connection identification patterns IPD. Control block 2112 may generate a register control signal CW22 in response to connection identification control signal CIC and seed data TSD to control register block 2142 to output connection identification patterns IPD corresponding to seed data TSD.

Register block 2142 may include an M-bit register 2122 that stores a connection identification pattern IPD having M bits. Seed data TSD may include an address of an entry of the M-bit register 2122 that stores connection identification pattern IPD. M-bit register 2122 may select a connection identification pattern IPD stored in M-bit register 2122 which corresponds to the seed data TSD, and provide each bit of the selected connection identification pattern IPD to IO unit 2200 through each of the data lines D1, D2, . . . , Dm, respectively, in response to register control signal CW22. M-bit register 2122 may include a multi purpose register (MPR) of semiconductor device 2000, for example. In some example embodiments, M-bit register 2122 may be able to store more than M bits data.

Figure 11:
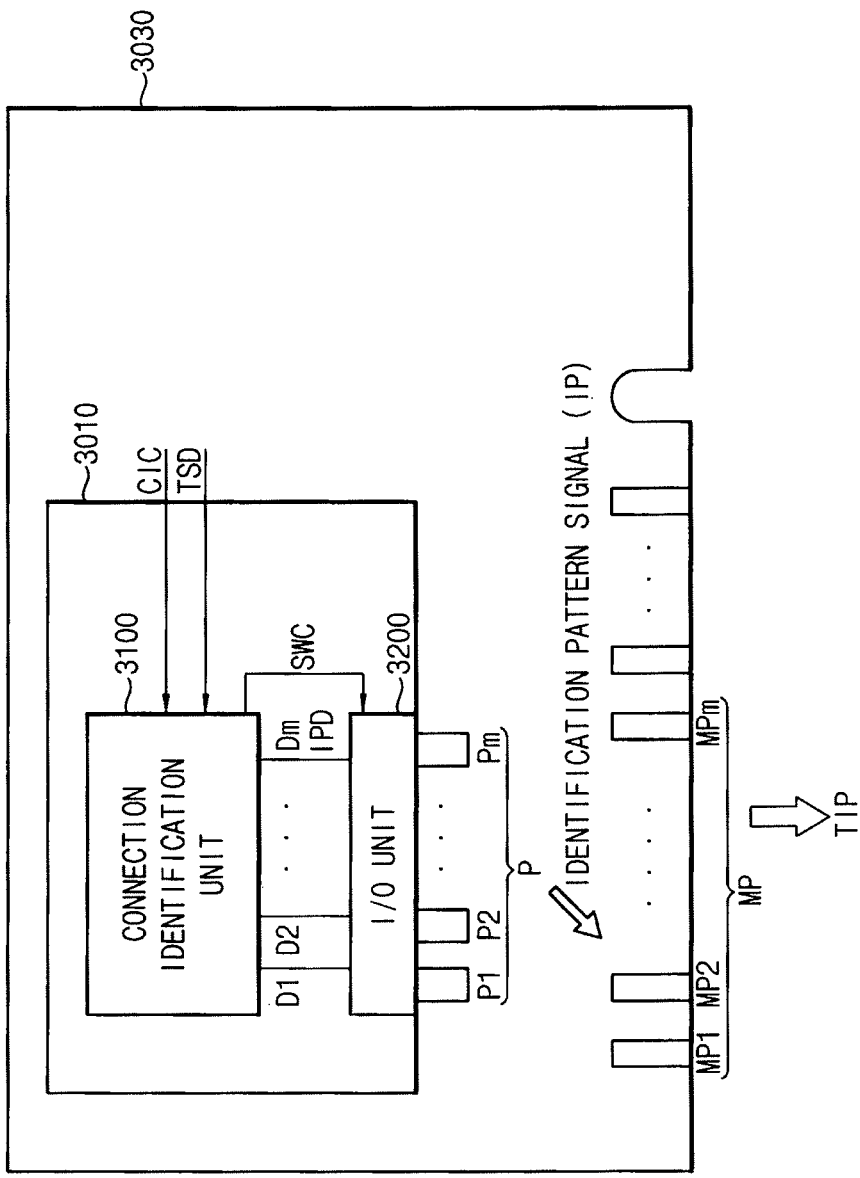
FIG. 11 is a block diagram illustrating a semiconductor module according to example embodiments in accordance with principles of inventive concepts.

FIG. 11 is a block diagram illustrating a semiconductor module according to exemplary embodiments according to principles of inventive concepts. Semiconductor module 3000 includes module pins MP1, MP2, . . . , MPm and a semiconductor device 3010, where M is a positive integer.

Semiconductor module 3000 of FIG. 11 may have the same structure and operation as semiconductor module 2000 of FIG. 8 except that connection identification unit 3100 included in the semiconductor module 3000 may further generate an input output (IO) control signal SWC, for example. A structure and an operation of semiconductor module 2000 of FIG. 8 are described above with reference to FIGS. 1 to 10. Therefore, a duplicated detailed description of semiconductor module 3000 of FIG. 11 will be omitted.

Semiconductor device 3010 may output identification pattern signal IP through device pins P1, P2, . . . , Pm in response to connection identification control signal CIC. In some exemplary embodiments in accordance with principles of inventive concepts, semiconductor device 3010 may output identification pattern signal IP through device pins P1, P2, . . . , Pm in response to connection identification control signal CIC and seed data TSD. For example, semiconductor device 3010 may select identification pattern signal IP based on seed data TSD. Connection identification control signal CIC and seed data TSD may be provided from outside of semiconductor module 3000.

Semiconductor device 3010 may include a connection identification unit 3100 and an input output (IO) unit 3200. Connection identification unit 3100 may output connection identification pattern IPD in response to connection identification control signal CIC and seed data TSD. Connection identification unit 3100 may generate IO control signal SWC based on seed data TSD. Connection identification control signal CIC may include a signal indicating a start of a connection identification operation.

IO unit 3200 may receive connection identification pattern IPD and output connection identification pattern IPD through device pins P1, P2, . . . , Pm as identification pattern signal IP based on IO control signal SWC. For example, IO unit 3200 may stabilize a signal level of at least one of device pins P1, P2, . . . , Pm to a predetermined signal level based on the IO control signal SWC. Device pins P1, P2, . . . , Pm may include data pins for outputting and receiving data.

In exemplary embodiments in accordance with principles of inventive concepts, each bit of identification pattern signal IP may correspond to each of device pins P1, P2, . . . , Pm, respectively, and one bit of identification pattern signal IP may have a first value and the remaining bits of identification pattern signal IP may have a second value. Therefore, identification pattern signal IP may indicate one of device pins P1, P2, . . . , Pm. The first value may be '1' and the second value may be '0'. Alternatively, the first value may be '0' and the second value may be T. Semiconductor device 3010 may output a plurality of identification pattern signals IP in a predetermined order. Alternatively, semiconductor device 3010 may output a plurality of identification pattern signals IP in an order determined based on seed data TSD. One of the identification pattern signals IP may correspond to one of device pins P1, P2, . . . , Pm.

In exemplary embodiments in accordance with principles of inventive concepts, semiconductor device 3010 may output a pattern sequence including L identification pattern signals IP, where L is a positive integer smaller than M. The pattern sequence may include M identification codes. Each of the M identification codes may have L bits. One of the M identification codes may correspond to one of device pins P1, P2, . . . , Pm. Semiconductor device 3010 may output the L identification pattern signals IP included in the pattern sequence in a predetermined order. Alternatively, semiconductor device 3010 may output the L identification pattern signals IP included in the pattern sequence in an order based on seed data TSD.

Semiconductor module 3000 may further include a printed circuit board (PCB) 3030 on which semiconductor device 3010 and module pins MP1, MP2, . . . , MPm are formed. Printed circuit board 3030 may have wiring that couples module pins MP1, MP2, . . . , MPm with device pins P1, P2, . . . , Pm. The configuration of wiring between module pins MP1, MP2, . . . , MPm and device pins P1, P2, . . . , Pm may be predetermined in consideration of a routing of the wiring. In some example embodiments, as illustrated in FIG. 15, semiconductor module 3000 may be a semiconductor memory module.

As described above, semiconductor module 3000 may output test identification pattern TIP in response to connection identification control signal CIC and seed data TSD. Identification pattern signal IP may have a predetermined pattern such that at least one identification pattern signal IP may indicate one of device pins P1, P2, . . . , Pm. Test identification pattern TIP may be generated by rearranging bits of identification pattern signal IP according to the configuration of the wiring between module pins MP1, MP2, . . . , MPm and device pins P1, P2, . . . , Pm. Therefore, the configuration of pin connections between module pins MP1, MP2, ..., MPm and device pins P1, P2, ..., Pm may be effectively identified by comparing the test identification pattern TIP with the identification pattern signal IP, which has a predetermined pattern.

Figure 12:
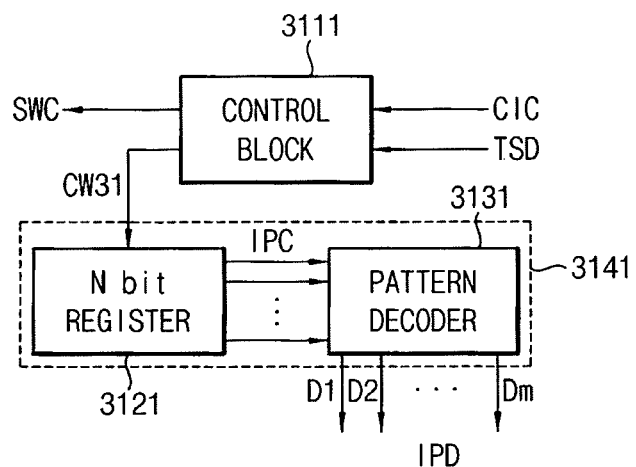
FIGS. 12 and 13 are block diagrams illustrating examples of a connection identification unit included in a semiconductor module in accordance with principles of inventive concepts of FIG. 11.

FIG. 12 is a block diagram illustrating an exemplary embodiment of a connection identification unit in accordance with principles of inventive concepts included in a semiconductor module of FIG. 11. A connection identification unit 3101 may include a register block 3141 and a control block 3111. Register block 3141 may store a plurality of connection identification patterns IPD. Control block 3111 may generate a register control signal CW31 in response to connection identification control signal CIC and seed data TSD to control register block 3141 to output connection identification pattern IPD corresponding to seed data TSD. Control block 3111 may generate IO control signal SWC based on seed data TSD and provide IO control signal SWC to IO unit 3200.

Register block 3141 may include an N-bit register 3121 and a pattern decoder 3131, where N is a positive integer smaller than M.

N-bit register 3121 may store the pattern code IPC that corresponds to connection identification pattern IPD. The pattern code IPC may have N bits. The pattern code IPC may be an encrypted version of connection identification pattern IPD. Seed data TSD may include pattern code IPC. N-bit register 3121 may output one of the pattern codes IPC stored in N-bit register 3121, which corresponds to seed data TSD, in response to register control signal CW31.

Pattern decoder 3131 may receive the pattern code IPC having N bits from N-bit register 3121 and generate the connection identification pattern IPD having M bits by decoding the pattern code IPC. Pattern decoder 3131 may provide each bit of the connection identification pattern IPD to IO unit 3200 through each of data lines D1, D2, ..., Dm, respectively. The pattern decoder 3131 may include an N-to-M multiplexer. In this case, M may be $2^N$.

Figure 13:
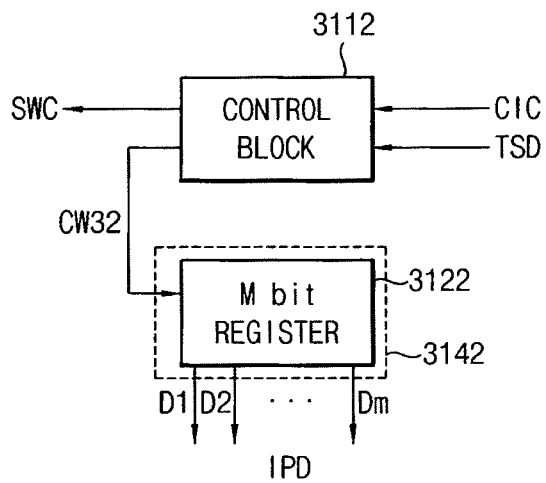

The block diagram of FIG. 13 illustrates another exemplary embodiment of a connection identification unit in accordance with principles of inventive concepts included in a semiconductor module of FIG. 11. A connection identification unit 3102 may include a register block 3142 and a control block 3112. Register block 3142 may store a plurality of connection identification patterns IPD. Control block 3112 may generate a register control signal CW32 in response to connection identification control signal CIC and seed data TSD to control register block 3142 to output connection identification patterns IPD corresponding to seed data TSD. Control block 3112 may generate IO control signal SWC based on seed data TSD and provide IO control signal SWC to IO unit 3200.

Register block 3142 may include an M-bit register 3122 that stores connection identification pattern IPD having M bits. Seed data TSD may include an address of an entry of M-bit register 3122 that stores connection identification pattern IPD. M-bit register 3122 may select one of the connection identification pattern IPD stored in M-bit register 3122, which corresponds to seed data TSD, and provide each bit of selected connection identification pattern IPD to IO unit 3200 through each of data lines D1, D2, ..., Dm, respectively, in response to register control signal CW32. M-bit register 3122 may include a multi purpose register (MPR) of semiconductor device 3000. In some example embodiments, M-bit register 3122 may be able to store more than M bits data.

Figure 14:
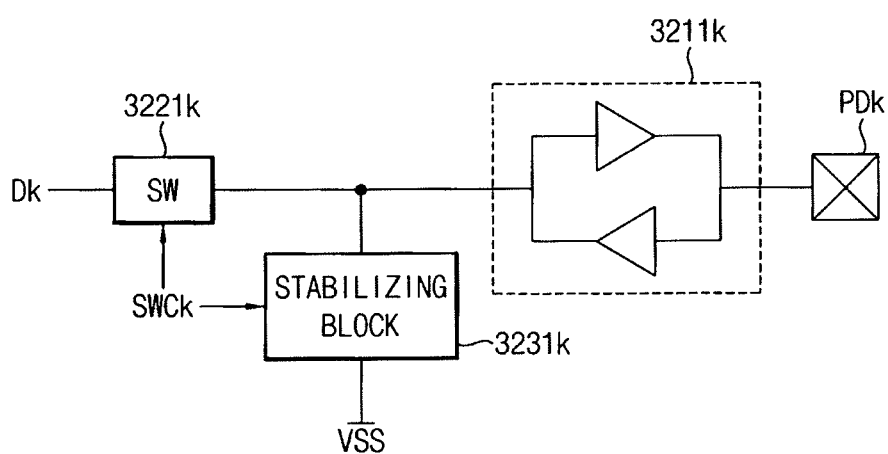
FIG. 14 is a block diagram illustrating an example of an IO unit included in a semiconductor module in accordance with principles of inventive concepts of FIG. 11.

FIG. 14 is a block diagram illustrating an exemplary embodiment in accordance with principles of inventive concepts of an IO unit included in a semiconductor module of FIG. 11. IO unit 3200 may include a plurality of IO blocks coupled between data lines D1, D2, ..., Dm and device pins P1, P2, ..., Pm, respectively. In FIG. 14, IO block 3201k coupled between a Kth data line Dk and a Kth device pin Pk is illustrated.

Connection identification unit 3100 may provide a plurality of IO control signals SWC1, SWC2, SWCm to IO blocks, respectively. IO block 3201k may include a switch block 3221k, a stabilizing block 3231k, an IO buffer 3211k and a pad PDk.

Pad PDk may be coupled to the Kth device pin Pk.

Switch block 3221k may control a connection between connection identification unit 3100 and the Kth device pin Pk based on IO control signal SWCk. That is, switch block 3221k may control a connection between the Kth data line Dk and pad PDk based on IO control signal SWCk.

Stabilizing block 3231k may stabilize a signal level of the Kth device pin Pk based on IO control signal SWCk. For example, stabilizing block 3231k may stabilize a signal level of pad PDk to the second value (for example, a ground voltage VSS) based on IO control signal SWCk. Stabilizing block 3231k may include a transistor or a switch controlled by IO control signal SWCk.

IO buffer 3211k may provide a signal received through Kth data line Dk to pad PDk and provide a signal received through pad PDk to the Kth data line Dk.

FIG. 15 is a block diagram illustrating an exemplary embodiment of a semiconductor module in accordance with principles of inventive concepts. Semiconductor module 4000 includes module pins MP1, MP2, ..., MPm and a semiconductor device 4010, where M is a positive integer.

Semiconductor module 4000 may have the same structure and operation as semiconductor module 1000 of FIG. 1 except that semiconductor device 4010 included in the semiconductor module 4000 further includes a memory unit 4300 and multiplexers MUX. A structure and operation of semiconductor module 1000 of FIG. 1 are described above with reference to FIGS. 1 to 7B. Therefore, a duplicated detailed description of semiconductor module 4000 of FIG. 15 will be omitted.

Semiconductor device 4010 may include a connection identification unit 4100, an input output (IO) unit 4200, a memory unit 4300, multiplexers MUX and device pins P1, P2, ..., Pm.

The semiconductor device 4010 may operate in a connection identification mode or a normal operation mode, for example.

In a connection identification mode, semiconductor device 4010 may perform a connection identification operation. That is, in a connection identification mode, connection identification unit 4100 may output a connection identification pattern IPD in response to connection identification control signal CIC. Connection identification control signal CIC may be provided from outside semiconductor module 4000. Connection identification control signal CIC may include a signal indicating a start of a connection identification operation.

In a normal operation mode, semiconductor device 4010 may perform a read and write operation. That is, in a normal operation mode, memory unit 4300 may write a write data received from IO unit 4200 or output read data to IO unit 4200, for example. Device pins P1, P2, ..., Pm may include data pins for outputting and receiving data.

Semiconductor device 4010 may select a connection identification mode or a normal operation mode in response to a control signal received from outside.

Multiplexers MUX may provide connection identification pattern IPD received from connection identification unit 4100 to IO unit 4200 in a connection identification mode. Multiplexers MUX may provide read data received from memory unit 4300 to IO unit 4200 and provide write data received from IO unit 4200 to memory unit 4300 in a normal operation mode.

IO unit 4200 may output connection identification pattern IPD as an identification pattern signal IP in a connection identification mode and output read data in a normal operation mode.

Semiconductor device 4010 may be a semiconductor memory device. For example, semiconductor device 4010 may include a volatile memory device such as a dynamic random access memory (DRAM) device, a static random access memory (SRAM) device, etc. and/or a non-volatile memory device such as an erasable programmable read-only memory (EPROM) device, an electrically erasable programmable read-only memory (EEPROM) device, a flash memory device, etc.

Module pins MP1, MP2, . . . , MPm may receive identification pattern signal IP and output a test identification pattern TIP in a connection identification mode. Identification pattern signal IP and test identification pattern TIP may have M bits. Bits of test identification pattern TIP may have a different arrangement from bits of identification pattern signal IP. For example, test identification pattern TIP may be generated by rearranging bits of identification pattern signal IP according to a configuration of pin connections between module pins MP1, MP2, . . . , MPm and device pins P1, P2, . . . , Pm. Module pins MP1, MP2, . . . , MPm may be coupled to an external device.

Semiconductor module 4000 may further include a printed circuit board (PCB) 4030 on which semiconductor device 4010 and module pins MP1, MP2, . . . , MPm are formed. Printed circuit board 4030 may have wiring that couples module pins MP1, MP2, . . . , MPm with device pins P1, P2, . . . , Pm. The configuration of the wiring between module pins MP1, MP2, . . . , MPm and device pins P1, P2, . . . , Pm may be predetermined in consideration of a routing of the wiring. Semiconductor module 4000 may be a semiconductor memory module since the semiconductor module 4000 includes the memory unit 4300. For example, semiconductor module 4000 may be a dual in-line memory module (DIMM), a single in-line memory module (SIMM), a rambus in-line memory module (RIMM), an unbuffered dual in-line memory module (UDIMM), a registered dual in-line memory module (RDIMM), a fully buffered dual in-line memory module (FBDIMM), a load reduced dual in-line memory module (LRDIMM), etc.

As described above, semiconductor module 4000 according to example embodiments may output a test identification pattern TIP in response to a connection identification control signal CIC. An identification pattern signal IP may have a predetermined pattern such that at least one identification pattern signal IP may indicate one of device pins P1, P2, . . . , Pm. The test identification pattern TIP may be generated by rearranging bits of an identification pattern signal IP according to a configuration of the wiring between module pins MP1, MP2, . . . , MPm and device pins P1, P2, . . . , Pm. Therefore, the configuration of the pin connections between module pins MP1, MP2, . . . , MPm and device pins P1, P2, . . . , Pm may be effectively identified by comparing a test identification pattern TIP with the identification pattern signal IP, which has a predetermined pattern.

Figure 16:
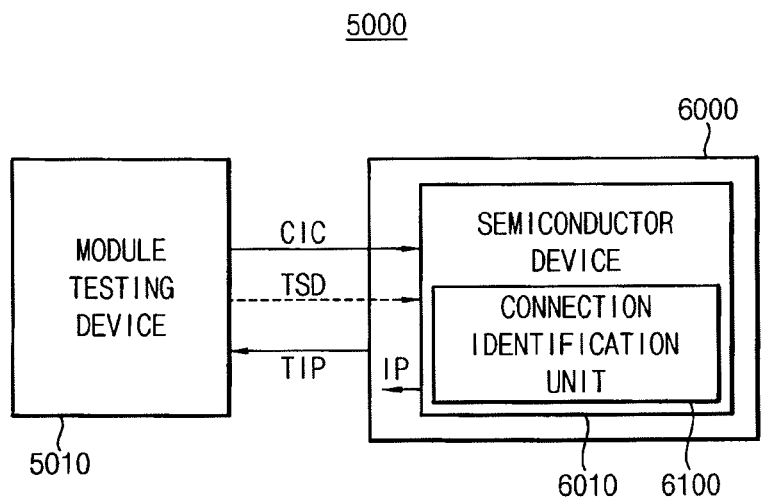
FIG. 16 is a block diagram illustrating a test system according to example embodiments in accordance with principles of inventive concepts.

The block diagram of FIG. 16 illustrates an exemplary embodiment of a test system in accordance with principles of inventive concepts. Test system 5000 includes a semiconductor module 6000 and a module testing device 5010. Semiconductor module 6000 outputs a test identification pattern TIP in response to a connection identification control signal CIC received from the module testing device 5010. Semiconductor module 6000 includes a plurality of module pins MP1, MP2, . . . , MPm and a semiconductor device 6010, where M is a positive integer.

Semiconductor device 6010 includes a plurality of device pins P1, P2, . . . , Pm and outputs an identification pattern signal IP through device pins P1, P2, . . . , Pm in response to connection identification control signal CIC. Identification pattern signal IP may be used for identifying a configuration of pin connections between module pins MP1, MP2, . . . , MPm and device pins P1, P2, . . . , Pm.

Semiconductor device 6010 may further include a connection identification unit 6100 and an input output (IO) unit. Connection identification unit 6100 may output a connection identification pattern IPD in response to connection identification control signal CIC. Connection identification control signal CIC may include a signal indicating a start of a connection identification operation. In exemplary embodiments in accordance with principles of inventive concepts, connection identification unit 6100 may select a connection identification pattern IPD based on seed data TSD received from module testing device 5010.

IO unit may receive connection identification pattern IPD and output connection identification pattern IPD through device pins P1, P2, . . . , Pm as the identification pattern signal IP.

Semiconductor module 6000 may be embodied as one of the semiconductor modules 1000, 2000, 3000 and 4000 of FIGS. 1, 8, 11 and 15, for example. A structure and an operation of the semiconductor modules 1000, 2000, 3000 and 4000 of FIGS. 1, 8, 11 and 15 are described above with reference to FIGS. 1 and 15. Therefore, a detailed description of semiconductor module 6000 will be omitted.

Module testing device 5010 provides a connection identification control signal CIC to semiconductor module 6000. Module testing device 5010 may further provide seed data TSD to semiconductor module 6000. Module testing device 5010 receives test identification pattern TIP, and identifies a configuration of pin connections between module pins MP1, MP2, . . . , MPm and device pins P1, P2, . . . , Pm of semiconductor module 6000, based on test identification pattern TIP.

In exemplary embodiments in accordance with principles of inventive concepts, as illustrated in FIG. 5, each bit of identification pattern signal IP may correspond to each of device pins P1, P2, . . . , Pm, respectively, and one bit of identification pattern signal IP may have a first value and the remaining bits of identification pattern signal IP may have a second value. Therefore, identification pattern signal IP may indicate one of device pins P1, P2, . . . , Pm. The first value may be '1' and the second value may be '0'. Alternatively, the first value may be '0' and the second value may be '1'. Semiconductor device 6010 may output a plurality of identification pattern signals IP in a predetermined order or in an order determined based on seed data TSD, where one of the identification pattern signals IP may correspond to one of device pins P1, P2, . . . , Pm.

One of module pins MP1, MP2, . . . , MPm that outputs the first value of test identification pattern TIP may be coupled with one of device pins P1, P2, . . . , Pm that outputs the first value of identification pattern signal IP. Therefore, module testing device 5010 may identify the configuration of pin connections between module pins MP1, MP2, . . . , MPm and device pins P1, P2, . . . , Pm by comparing test identification pattern TIP with identification pattern signal IP, which has a predetermined pattern.

In exemplary embodiments in accordance with principles of inventive concepts, as illustrated in FIG. 6, semiconductor device 6010 may output third pattern sequence SEQ3, including L identification pattern signals IP, where L is a positive integer smaller than M. Third pattern sequence SEQ3 may include M identification codes, for example. Each of the M identification codes may have L bits. One of the M identification codes may correspond to one of device pins P1, P2, . . . , Pm. Semiconductor device 6010 may output L identification pattern signals IP included in third pattern sequence SEQ3 in a predetermined order or in an order determined based on seed data TSD. Module pins MP1, MP2, . . . , MPm may receive third pattern sequence SEQ3 including the L identification pattern signals IP and output the fourth pattern sequence SEQ4 including L test identification patterns TIP.

One of module pins MP1, MP2, . . . , MPm that outputs a Kth identification code ICk may be coupled with one of device pins P1, P2, . . . , Pm that outputs the Kth identification code ICk. Therefore, module testing device 5010 may identify the configuration of pin connections between module pins MP1, MP2, . . . , MPm and device pins P1, P2, . . . , Pm by comparing the M identification codes IC included in the fourth pattern sequence SEQ4 with the M identification codes IC included in third pattern sequence SEQ3.

As described above, semiconductor module 6000 included in test system 5000 may output test identification pattern TIP in response to connection identification control signal CIC received from module testing device 5010. Identification pattern signal IP may have a predetermined pattern such that at least one identification pattern signal IP may indicate one of device pins P1, P2, . . . , Pm. Test identification pattern TIP may be generated by rearranging bits of identification pattern signal IP according to the configuration of wiring between module pins MP1, MP2, . . . , MPm and device pins P1, P2, . . . , Pm. Therefore, module testing device 5010 included in test system 5000 may identify the configuration of pin connections between module pins MP1, MP2, . . . , MPm and device pins P1, P2, . . . , Pm of semiconductor module 6000 by comparing test identification pattern TIP with identification pattern signal IP, which has a predetermined pattern.

Figure 17:
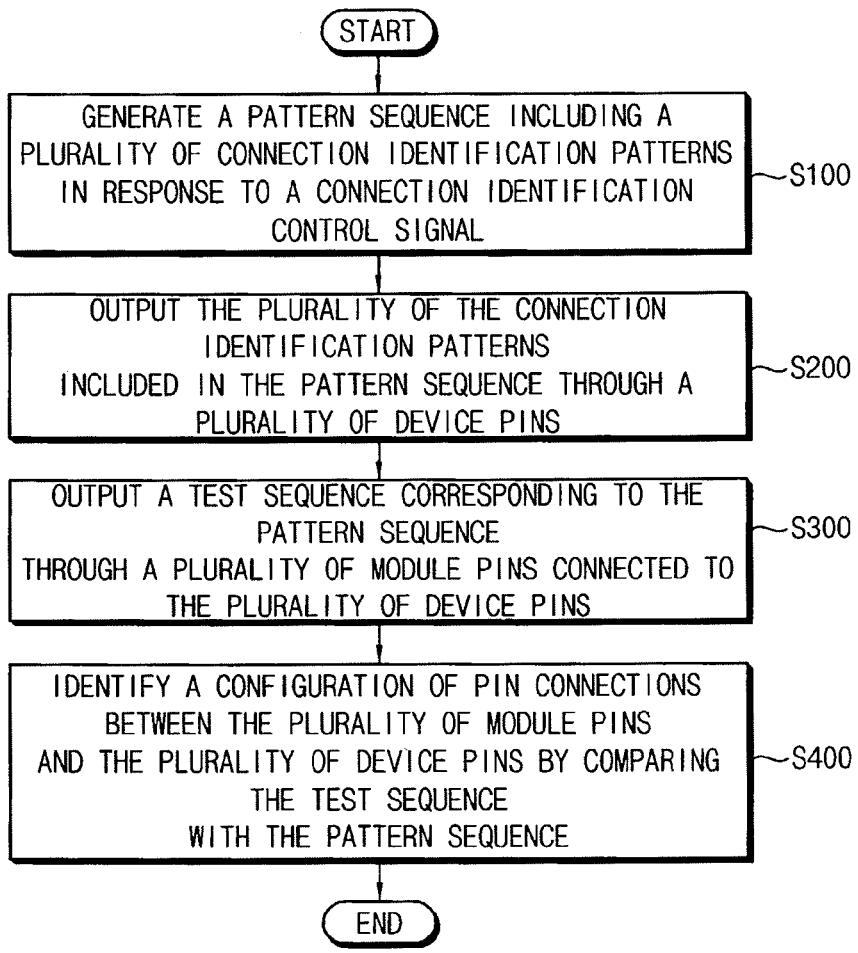
FIG. 17 is a flow chart illustrating a method of identifying a configuration of pin connections of a semiconductor module according to example embodiments in accordance with principles of inventive concepts.

FIG. 17 is a flow chart illustrating an exemplary embodiment of a method of identifying a configuration of pin connections of a semiconductor module in accordance with principles of inventive concepts. Such a method may be employed by test system 5000 of FIG. 16. Semiconductor module 6000 included in test system 5000 may be embodied as one of the semiconductor modules 1000, 2000, 3000 and 4000 of FIGS. 1, 8, 11 and 15, for example.

Referring to FIGS. 1 to 17, connection identification unit 1100 generates a pattern sequence including a plurality of connection identification patterns IPD in response to connection identification control signal CIC (S100). In some example embodiments, connection identification patterns IPD may be stored in connection identification unit 1100 in a predetermined order, and connection identification unit 1100 may generate connection identification patterns IPD in a predetermined order in response to connection identification control signal CIC. In other example embodiments, connection identification unit 1100 may generate connection identification patterns IPD in an order determined based on seed data TSD.

IO unit 1200 outputs connection identification patterns IPD included in the pattern sequence through device pins P1, P2, . . . , Pm as a plurality of the identification pattern signals IP (S200). In some example embodiments, IO unit 1200 may stabilize a signal level of at least one of device pins P1, P2, . . . , Pm to a predetermined signal level based on seed data TSD while outputting connection identification patterns IPD included in the pattern sequence through device pins P1, P2, . . . , Pm.

Module pins MP1, MP2, . . . , MPm may be connected to device pins P1, P2, . . . , Pm by wiring according to a predetermined circuit design. For example, the configuration of pin connections between module pins MP1, MP2, . . . , MPm and device pins P1, P2, . . . , Pm may be determined in consideration of a routing of the wiring.

Module pins MP1, MP2, . . . , MPm receive the pattern sequence including identification pattern signals IP and output a test sequence including a plurality of test identification patterns TIP corresponding to the pattern sequence (S300). Identification pattern signal IP and test identification pattern TIP may have M bits. Bits of test identification pattern TIP may have a different arrangement from bits of identification pattern signal IP. For example, test identification pattern TIP may be generated by rearranging bits of identification pattern signal IP according to the configuration of pin connections between module pins MP1, MP2, . . . , MPm and device pins P1, P2, . . . , Pm.

The module testing device 5010 of FIG. 16 identifies a configuration of pin connections between module pins MP1, MP2, . . . , MPm and device pins P1, P2, . . . , Pm by comparing the test sequence with the pattern sequence (S400).

While inventive concepts have been particularly shown and described with reference to exemplary embodiments thereof, it will be understood by those of ordinary skill in the art that various changes in form and details may be made therein without departing from the spirit and scope of inventive concepts as defined by the following claims. It is therefore desired that the present embodiments be considered in all respects as illustrative and not restrictive, reference being made to the appended claims rather than the foregoing description to indicate the scope of inventive concepts.

What is claimed is:

1. A semiconductor module, comprising:
    a plurality of module pins configured to receive an identification pattern signal having M bits, and to output a test identification pattern, where M is a positive integer; and
    a semiconductor device including a plurality of device pins, the semiconductor device outputting the identification pattern signal through the plurality of device pins in response to a connection identification control signal for identifying a configuration of pin connections between the plurality of module pins and the plurality of device pins,
    wherein the semiconductor device outputs a pattern sequence including L identification pattern signals, where L is a positive integer smaller than M,
    wherein the pattern sequence includes M identification codes, each of the M identification codes having L bits, one of the M identification codes corresponding to one of the plurality of device pins.

2. The semiconductor module of claim 1, wherein the semiconductor device comprises:
    a connection identification unit configured to output a connection identification pattern in response to the connection identification control signal; and
    an input output (IO) unit configured to receive the connection identification pattern and to output the connection identification pattern through the plurality of device pins as the identification pattern signal.

3. The semiconductor module of claim 2, wherein the connection identification unit comprises:
   a register block configured to store the connection identification pattern; and
   a control block configured to control the register block to output the connection identification pattern in response to the connection identification control signal.

4. The semiconductor module of claim 3, wherein the register block comprises:
   an N-bit register configured to store a pattern code corresponding to the connection identification pattern, the pattern code having N bits, where N is a positive integer smaller than M; and
   a pattern decoder configured to receive the pattern code and to generate the connection identification pattern having M bits by decoding the pattern code.

5. The semiconductor module of claim 3, wherein the register block comprises an M-hit register configured to store the connection identification pattern having M bits, the M-bit register outputting the connection identification pattern to the IO unit.

6. The semiconductor module of claim 5, wherein the M-bit register includes a multi purpose register (MPR) of the semiconductor device.

7. The semiconductor module of claim 2, wherein the connection identification unit comprises:
   a pattern generating block configured to generate the connection identification pattern; and
   a control block configured to control the pattern generating block to output the connection identification pattern in response to the connection identification control signal.

8. The semiconductor module of claim 1, wherein the semiconductor device comprises:
   a connection identification unit configured to output a connection identification pattern in response to the connection identification control signal and a seed data; and
   an input output (IO) unit configured to receive the connection identification pattern and to output the connection identification pattern through the plurality of device pins as the identification pattern signal.

9. The semiconductor module of claim 8, wherein the connection identification unit comprises:
   a register block configured to store the connection identification pattern; and
   a control block configured to control the register block to output the connection identification pattern corresponding to the seed data in response to the connection identification control signal.

10. The semiconductor module of claim 1, wherein the semiconductor device comprises:
    a connection identification unit configured to output a connection identification pattern in response to the connection identification control signal, the connection identification unit outputting an IO control signal based on a seed data received from outside; and
    an input output (IO) unit configured to receive the connection identification pattern and to output the connection identification pattern through the plurality of device pins as the identification pattern signal based on the IO control signal.

11. The semiconductor module of claim 10, wherein the IO unit comprises a switch block configured to control a connection between the connection identification unit and the plurality of device pins based on the IO control signal.

12. The semiconductor module of claim 11, wherein the IO unit further comprises a stabilizing block configured to stabilize a signal level of the plurality of device pins based on the IO control signal.

13. The semiconductor module of claim 1, wherein each bit of the identification pattern signal corresponds to each of the plurality of device pins, respectively, and one bit of the identification pattern signal has a first value and the rest bits of the identification pattern signal has a second value, and
    wherein the semiconductor device outputs a plurality of the identification pattern signals in a predetermined order, one of the plurality of the identification pattern signals corresponding to one of the plurality of device pins.

14. A test system, comprising:
    a semiconductor module configured to output a test identification pattern in response to a connection identification control signal; and
    a module testing device configured to output the connection identification control signal, the module testing device identifying a configuration of pin connections of the semiconductor module based on the test identification pattern,
    wherein the semiconductor module comprises:
    a plurality of module pins configured to receive an identification pattern signals having M bits and to output the test identification pattern, where M is a positive integer; and
    a semiconductor device including a plurality of device pins, the semiconductor device outputting the identification pattern signal through the plurality of device pins in response to the connection identification control signal for identifying a configuration of pin connections between the plurality of module pins and the plurality of device pins, wherein the semiconductor device outputs a pattern sequence including L identification pattern signals, where L is a positive integer smaller than M, and
    wherein the pattern sequence includes M identification codes, each of the M identification codes having L bits, one of the M identification codes corresponding to one of the plurality of device pins.

* * * * *